US008536941B2

(12) United States Patent
Hongo et al.

(10) Patent No.: US 8,536,941 B2
(45) Date of Patent: Sep. 17, 2013

(54) AMPLIFYING DEVICE AND METHOD INVOLVING ENVELOPE SIGNAL

(75) Inventors: Hironobu Hongo, Kawasaki (JP); Katsutoshi Ishidoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 50 days.

(21) Appl. No.: 13/301,456

(22) Filed: Nov. 21, 2011

(65) Prior Publication Data

US 2012/0154035 A1 Jun. 21, 2012

(30) Foreign Application Priority Data

Dec. 21, 2010 (JP) ................................ 2010-284261

(51) Int. Cl.
*H03G 3/20* (2006.01)

(52) U.S. Cl.
USPC .......................................... 330/127; 330/136

(58) Field of Classification Search
USPC ................................... 330/10, 127, 136, 297
See application file for complete search history.

(56) References Cited

U.S. PATENT DOCUMENTS

| | | | | |
|---|---|---|---|---|
| 7,339,426 | B2 * | 3/2008 | Gurvich et al. | 330/136 |
| 2011/0241775 | A1 * | 10/2011 | Kunihiro et al. | 330/127 |

FOREIGN PATENT DOCUMENTS

| | | |
|---|---|---|
| JP | 2000-165151 | 6/2000 |
| JP | 2005-184273 | 7/2005 |
| JP | 2006-254345 | 9/2006 |
| WO | WO-2008/099489 | 8/2008 |

* cited by examiner

*Primary Examiner* — Steven J Mottola
(74) *Attorney, Agent, or Firm* — Fujitsu Patent Center

(57) ABSTRACT

An amplifying device which amplifies a signal, includes: an amplifier which amplifies an input signal by a power supplied from a power node; a first power source which supplies a fixed voltage to the power node; a second power source which supplies a variable voltage to the power node based on an envelope signal relating to the input signal and voltage of the power node; an active short device which reduces impedance of the power node when the first power source supplies the power to the power node and the second power source does not supply the power to the power node; a synthesizer which synthesizes the envelope signal and a cancel signal so that the second power source does not supply the power to the power node according to voltage variation of the power node by the active short device.

12 Claims, 15 Drawing Sheets

AMPLIFYING DEVICE AND METHOD INVOLVING ENVELOPE SIGNAL

CROSS-REFERENCE TO RELATED APPLICATIONS

This application is based upon and claims the benefit of priority from the prior Japanese Patent Application No. 2010-284261 filed on Dec. 21, 2010, the entire contents of which are incorporated herein by reference.

FIELD

The embodiments discussed herein are related to power supply of an amplifying device that amplifies a signal.

BACKGROUND

In recent years, electronic apparatuses are desired to achieve power saving as international environmental cooperation has been considered. For example, in the final stage of a transmitting unit of a base station in a mobile phone system, an amplifying device is provided to amplify a transmission signal, and power consumption reduction of the amplifying device is desired.

Envelope tracking is an example of a method for improving power efficiency of the amplifying device. The envelope tracking is a technique for supplying a power source voltage according to an amplitude of the signal to be amplified by the amplifier of the amplifying device so that power loss is reduced.

For example, the envelope tracking supplies simply the power of a fixed voltage by a high efficient power source if the envelope of the amplified signal is equal to or smaller than a prescribed threshold value (a fixed voltage power mode). If the envelope of the amplified signal exceeds the prescribed threshold value, the envelope tracking supplies the power of a variable voltage according to the amplified signal to the amplifier from a low efficient power source. In this manner, the envelope tracking improves the power efficiency by switching the power source based on the size of the envelope of the signal to be amplified.

SUMMARY

An amplifying device which amplifies a signal, includes: an amplifier which amplifies an input signal by a power supplied from a power node; a first power source which supplies a fixed voltage to the power node; a second power source which supplies a variable voltage to the power node based on an envelope signal relating to the input signal and voltage of the power node; an active short device which reduces impedance of the power node when the first power source supplies the power to the power node and the second power source does not supply the power to the power node; a synthesizer which synthesizes the envelope signal and a cancel signal so that the second power source does not supply the power to the power node according to voltage variation of the power node by the active short device.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DETAILED DESCRIPTION OF THE EMBODIMENTS

The conventional amplifying device has a problem that power efficiency is decreased because power of a variable voltage is supplied to an amplifier in a fixed voltage power mode. An aspect of the present invention is to provide an amplifying device that suppresses reduction of the power efficiency.

With reference to the diagrams, embodiments will be described in detail.

[First Embodiment]

Figure 1:
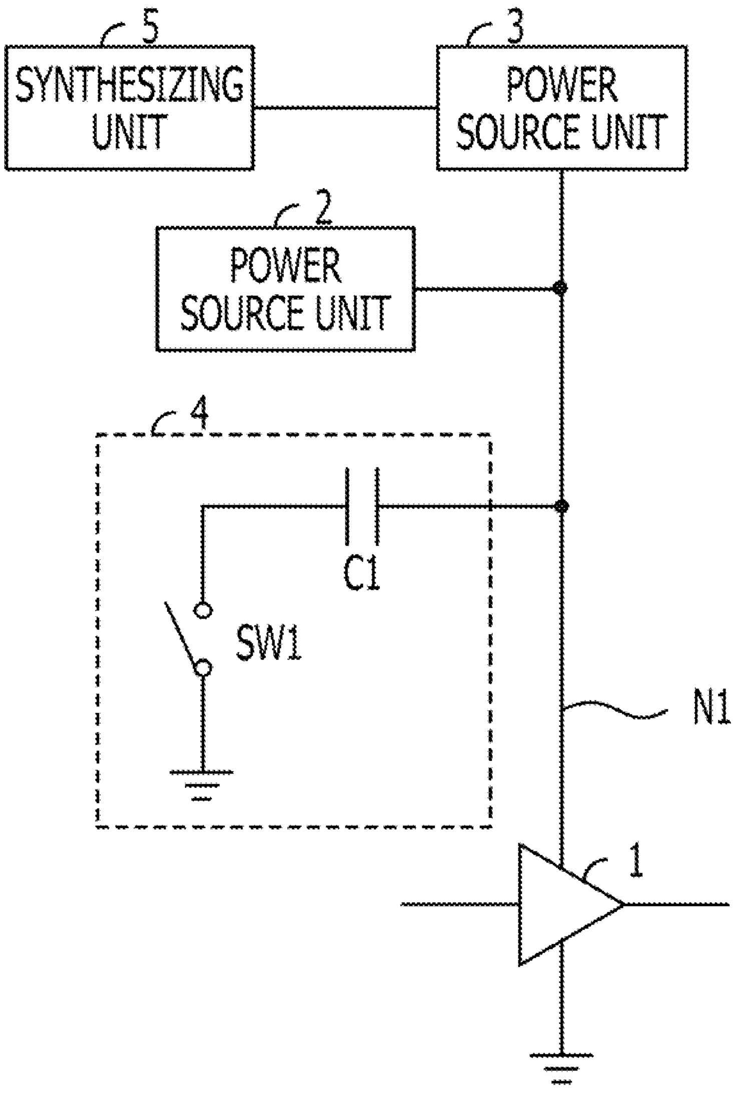
FIG. 1 is a diagram illustrating an example of an amplifying device according to a first embodiment.

FIG. 1 is a diagram illustrating an example of an amplifying device according to a first embodiment. As illustrated in FIG. 1, the amplifying device includes an amplifying unit 1, a power source unit 2, a power source unit 3, an Active Short (AS) device 4, a synthesizing unit 5, and a power node N1.

An input signal to be amplified is input into the amplifying unit 1. The input signal is, for example, a modulated signal. The amplifying unit 1 amplifies the input signal by the power supplied to the power node N1.

The power source unit 2 supplies the power of the fixed voltage to the power node N1. The power source unit 2 has an efficiency that is higher than the efficiency of the power source unit 3. If the envelope of the input signal is lower than a prescribed threshold value voltage, the amplifying device supplies the power of the power source unit 2 to the amplifying unit 1 (the fixed voltage power mode). If the envelope of the input signal exceeds the prescribed threshold value, the amplifying device supplies the power of the power source unit 3 to the amplifying unit 1 (the variable voltage power mode).

Based on the envelope signal of the input signal amplified by the amplifying unit 1 and on the voltage of the power node N1, the power source unit 3 supplies the power of the variable voltage to the power node N1.

For example, the power source unit 3 includes a transistor of a Negative-channel Metal-Oxide Semiconductor (NMOS). For example, if the power source unit 3 includes the transistor, a gate is coupled to the synthesizing unit 5, and a drain is coupled to the power source of a constant voltage, and the source is coupled to the power node N1. With respect to the voltage of the power node N1 of the source, if the envelop signal of the gate exceeds the threshold value of the transistor, the transistor supplies the power of the variable voltage according to the envelop signal to the power node N1.

The AS device 4 includes, for example, a condenser C1 and a switch SW1. In the fixed voltage power mode, the switch SW1 grounds the power node N1 to the ground through the condenser C1. In the variable voltage power mode, the switch SW1 releases the ground of the power node N1 through the condenser C1. That is, in the fixed voltage power mode, the AS device 4 reduces the impedance of the power node N1 and suppresses fluctuation of the voltage of the power node N1.

In the fixed voltage power mode, the synthesizing unit 5 synthesizes the envelope signal and the cancel signal so that the power source unit 3 does not supply the power to the power node N1 according to the voltage variation by the AS device 4 of the power node N1.

For example, it is preferable that the AS device 4 does not have a resistance component. Actually, however, the resistance component is included in the condenser C1 or the switch SW1. In the fixed voltage power mode, the current flows into the resistance component, and the voltage of the power node N1 is reduced. According to the reduction of the voltage of the power node N1, if a voltage that supplies the power of the power source unit 3 is produced between the envelope signal and the voltage of the power node N1 (for example, if a voltage exceeds the threshold value of the transistor is produced), the power source unit 3 is turned on even in the fixed voltage power mode and supplies the power. In the fixed voltage power mode, the synthesizing unit 5 synthesizes the envelope signal and the cancel signal so that the power source unit 3 does not supply the power (for example, the transistor is not turned on).

Figure 2A:
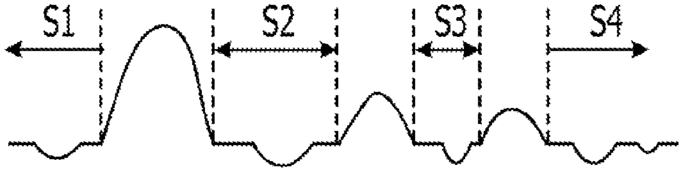
FIGS. 2A, 2B, 2C and 2D are diagrams illustrating operation of the amplifying device illustrated in FIG. 1.
Figure 2B:
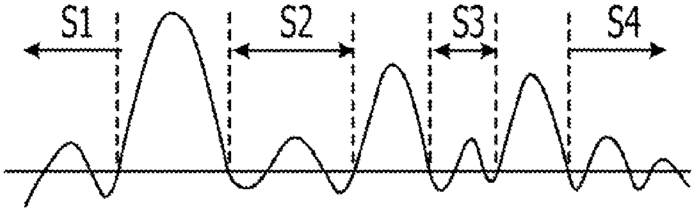
Figure 2C:
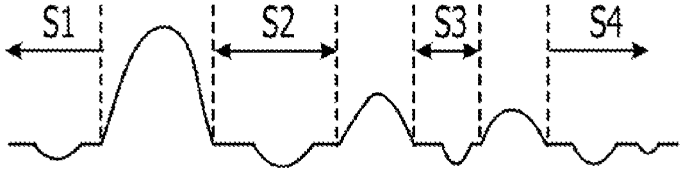
Figure 2D:
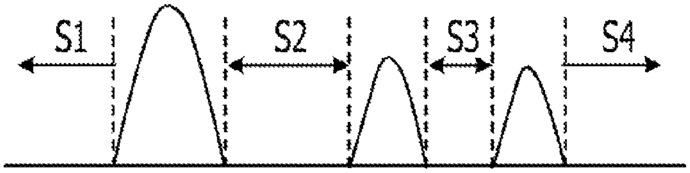

FIGS. 2A, 2B, 2C and 2D are diagrams illustrating operation of the amplifying device illustrated in FIG. 1. FIG. 2A illustrates an envelope signal output from the synthesizing unit 5. FIG. 2B illustrates a load current that flows into the power node N1. FIG. 2C illustrates a voltage waveform output from the power source unit 3. FIG. 2D illustrates a waveform output from the power source unit 3. Operations S1 to S4 illustrated in FIG. 2 indicate the fixed voltage power mode in which simply the power source unit 2 supplies the power to the amplifying unit 1.

Since Operations S1 to S4 illustrated in FIG. 2A are in the fixed voltage power mode, the envelope signal is in the no-signal state (for example, a constant signal) so that the power source unit 3 (for example, the transistor) normally does not supply the power according to the envelope signal. As illustrated in Operations S1 to S4 in FIG. 2A, however, the cancel signal (the waveform with a downward peak) is synthesized by the synthesizing unit 5.

The load current that flows into the power node N1 varies as illustrated in FIG. 2B. The load current that flows into the power node N1 varies according to the amplification operation by the amplifying unit 1. Thus, the load current varies according to the envelope of the input signal to be input into the amplifying unit 1. For example, if the envelope of the input signal becomes large, the load current becomes large.

In the fixed voltage power mode, as described above, the load current flows into the AS device 4. Accordingly, as illustrated in the periods from S1 to S4 in FIG. 2C, the voltage of the output (for example, the source of the transistor) of the power source unit 3 is reduced.

Due to the reduction of the voltage, the power source unit 3 (for example, the transistor) supplies the power to the amplifying unit 1. However, as illustrated in FIG. 2A, the envelope signal to be input into the power source unit 3 and the cancel signal are synthesized so that the power source unit 3 does not supply the power (for example, the transistor is not turned on). For example, the cancel signal is a signal that varies in the similar way in which the voltage of the power node N1 varies in the fixed voltage power mode.

Accordingly, as illustrated in the periods from S1 to S4 in FIG. 2D, the power supply by the variable voltage of the power source unit 3 is suppressed, and the reduction of the power efficiency is suppressed in the fixed voltage power mode. As described above, when the power source unit 3 is in the fixed voltage power mode, the amplifying device synthesizes the envelope signal and the cancel signal so that the power source unit 3 does not supply the power to the power node N1 according to the voltage variation of the power node N1 by the AS device 4. The power source unit 3 of the amplifying unit does not supply the power by the variable voltage to the amplifying unit 1 in the fixed voltage power mode, and the reduction of the power efficiency may be suppressed.

[Second Embodiment]

Figure 3:
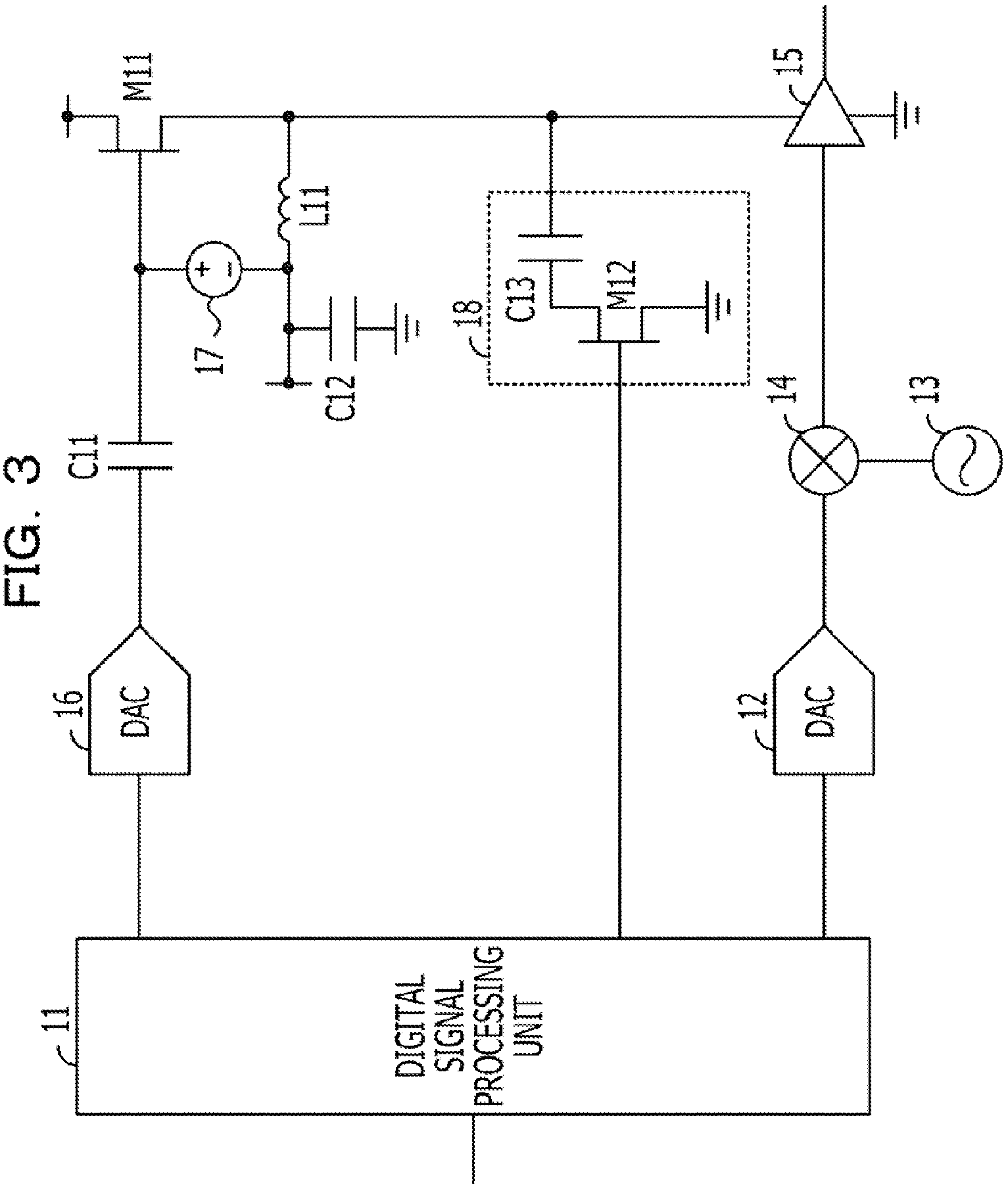
FIG. 3 is a diagram illustrating an example of a circuit block of an amplifying device according to a second embodiment.

With reference to the diagrams, a second embodiment will be described in detail. FIG. 3 is a diagram illustrating an example of a circuit block of an amplifying device according to the second embodiment. As illustrated in FIG. 3, the amplifying device includes a digital signal processing unit 11, Digital to Analog Converters (DACs) 12 and 16, an oscillator 13, a multiplier 14, an amplifier 15, condensers C11 to C13, a bias power source 17, transistors M11 and M12, an inductor L11, and an AS circuit 18. For example, the amplifying device illustrated in FIG. 3 is applied to a base station of a mobile phone system.

Figure 4:
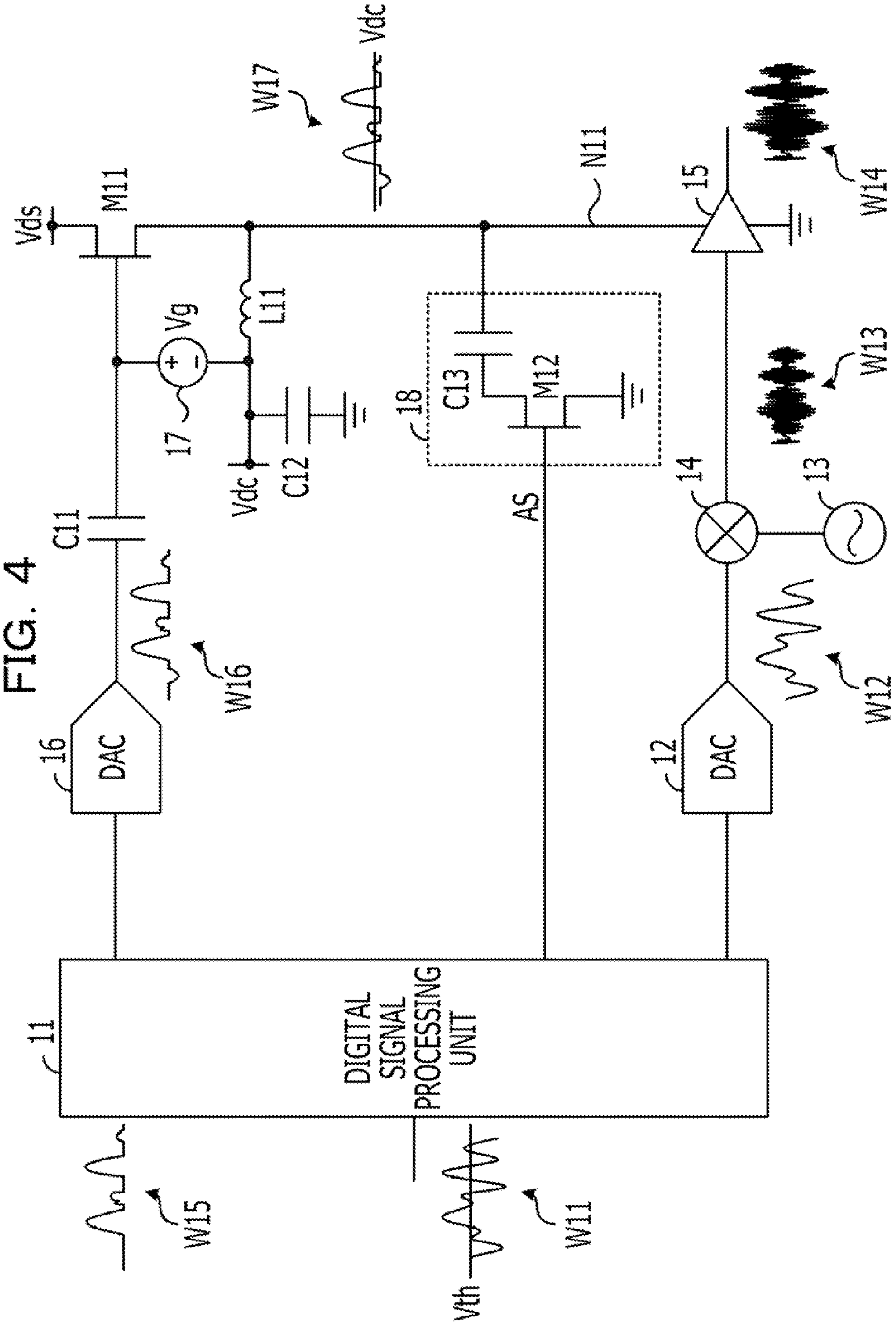
FIG. 4 is a diagram illustrating the amplifying device illustrated in FIG. 3 added with a signal waveform.

FIG. 4 is a diagram of the amplifying device illustrated in FIG. 3 added with a signal waveform. In FIG. 4 and FIG. 3, the similar components are indicated with the similar numerals. For example, the transmission signal illustrated in a waveform W11 is input into the digital signal processing unit 11. For example, the transmission signal is a signal that is to be radio-transmitted to a mobile phone. The transmission signal is input with a digital value into the digital signal processing unit 11. However, the transmission signal is indicated in an analog form in the waveform W11. The digital signal processing unit 11 includes, for example, a Digital Signal Processor (DSP) and a Central Processing Unit (CPU).

The transmission signal is distorted by a nonlinearity or the like of the amplifier 15. The digital signal processing unit 11 outputs the transmission signal, which is subjected to distortion compensation processing, to the DAC 12. The DAC 12 digital-analog converts the transmission signal output from the digital signal processing unit 11. A waveform W12 indicates the transmission signal that is digital-analog converted by the DAC 12.

The oscillator 13 outputs an oscillation signal to modulate the transmission signal into a radio signal of radio frequency. A multiplier 14 multiplies the transmission signal output from the DAC 12 by an oscillation signal output from the oscillator 13 and outputs a radio signal. A waveform W13 illustrates the radio signal output from the multiplier 14.

The power is supplied to an amplifier 15 through a power node N11. The amplifier 15 amplifies the radio signal output from the multiplier 14 by the power supplied from the power node N11. The amplified radio signal is radio-transmitted to, for example, a mobile phone through an antenna. A waveform 14 indicates the radio signal that is amplified by the amplifier 15.

The digital signal processing unit 11 outputs an envelope signal based on the envelope of the radio signal that is amplified by the amplifier 15. In this case, the radio signal amplified by the amplifier 15 is obtained by modulating a transmission signal that is input into the digital signal processing unit 11. The digital signal processing unit 11 outputs the signal, which exceeds a prescribed threshold value (Vth indicated in the waveform W11) of the input transmission signal, as an envelope signal. The waveform W15 indicates the envelope signal of the transmission signal that exceeds the prescribed threshold value.

The digital signal processing unit 11 will be described below in detail. The digital signal processing unit 11 outputs the envelope signal obtained by synthesizing the envelope signal to be output and the cancel signal. The envelope signal illustrated in the waveform W15 indicates the envelope signal of the transmission signal that exceeds the prescribed threshold value and does not include the cancel signal.

The DAC 16 digital-analog converts the envelope signal that is resulted in the synthesis of the cancel signal and is then output from the digital signal processing unit 11. A waveform W16 indicates the envelope signal that is digital-analog converted by the DAC 16. The downward peak illustrated in the waveform W16 indicates a cancel signal component. Hereinafter, the envelope signal resulted in the synthesis of the cancel signal may be referred to as an envelope signal.

The transistor M11 is, for example, a transistor of the NMOS. The envelope signal is input into the gate of the transistor M11 through the condenser C11. The bias voltage of a voltage Vg is supplied to the gate of the transistor M11 from the bias power source 17.

The drain of the transistor M11 is coupled to a power source of a voltage Vds. The source of the transistor M11 is coupled to the power node N11. Based on the voltage of the envelope signal input into the gate and on the source voltage (the voltage of the power node N11), the transistor M11 supplies the power of the voltage according to a variation of the envelope signal to the power node N11.

The power source of a voltage Vdc is coupled to the power node N11 through an inductor L11. The power source of the voltage Vdc is coupled to the ground through a condenser C12. The power source of the voltage Vdc has a voltage that is lower than the voltage of the power source of the voltage Vds. On the other hand, the power of the voltage Vdc has a high efficiency. The power source of the voltage Vdc supplies the power of a fixed voltage (Vdc) to the power node N11.

The transistor M11 is a linear amplifier that supplies the power of the variable voltage to the power node N11 based on the envelope signal and the voltage of the power node N11. Hereinafter, the transistor M11 is referred to as a linear amplifier, and the power source of the voltage Vdc is referred to as a fixed voltage power source.

The inductor L11 combines an output voltage of the fixed voltage power source and the output voltage of the linear amplifier. A waveform W17 indicates the voltage waveform that is obtained by combining the output voltage of the fixed voltage power source and the output voltage of the linear amplifier.

That is, if the envelope signal (for example, an upward peak illustrated in the waveform W11) as an existence signal is input into the gate of the linear amplifier, the amplifying device supplies the power to the amplifier 15 after superimposing the power of the linear amplifier on the power of the fixed voltage power source. If the no-signal (for example, the flat part in the waveform W16) or the envelope signal of the cancel signal is input into the gate of the linear amplifier, the amplifying device supplies the power of the fixed voltage power source to the amplifier 15.

That is, if the envelope of the radio signal to be input into the amplifier 15 is small, the amplifying device supplies the power of the high efficiency power source to the amplifier 15. If the envelope of the radio signal is large, the amplifying device supplies the power of the power source, which may output a high voltage with a low efficiency, according to the envelope. Due to this, the amplifying device improves the efficiency of the amplifier 15. If the period in which the power of the fixed voltage power source is supplied is longer and if the voltage is set low, the power saving is achieved.

The AS circuit 18 includes the condenser C13 and the transistor M12. One end of the condenser C13 is coupled to the power node N11, and the other end of the condenser C13 is coupled to the drain of the transistor M12.

The transistor M12 is, for example, a transistor of the NMOS. The gate of the transistor M12 is coupled to the digital signal processing unit 11. The source of the transistor M12 is coupled to the ground.

The power node N11 is grounded through the condenser C13 by switching the transistor M12 from ON to OFF. The digital signal processing unit 11 outputs the AS signal so that the power node N11 is grounded through the condenser C13 in the fixed voltage power mode in which simply the fixed voltage power supplies the power to the power node N11.

That is, the AS circuit 18 actively controls a bypass condenser (the condenser C13) and reduces the impedance of the power node N11 in the fixed voltage power mode. Hereinafter, grounding the power node N11 through the condenser C13 is referred to as AS. Moreover, supplying the power to the power node N11 by the fixed voltage power and the linear amplifier is referred to as a variable voltage power mode.

Figure 5:
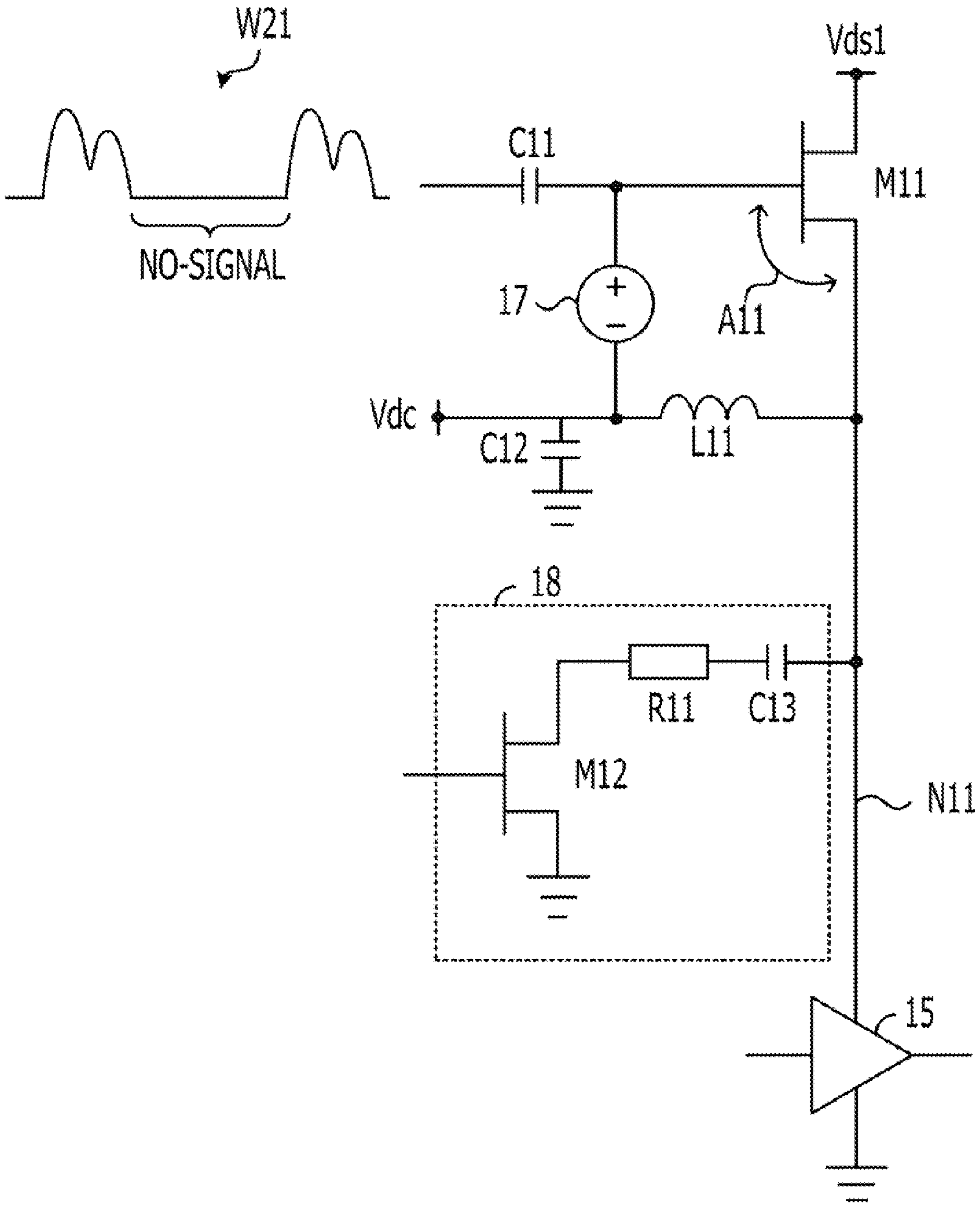
FIG. 5 is a diagram illustrating reduction of a power efficiency.

Before the synthesis of the cancel signal is described in detail, the reduction of the power efficiency by the current flowing into the AS circuit 18 will be described below. FIG. 5 is a diagram illustrating a decrease of the power efficiency. FIG. 5 illustrates a part of the amplifying device illustrated in FIG. 3.

FIG. 5 illustrates the waveform W21 of the envelope signal to be input into the linear amplifier. In FIG. 5, the parts equivalent to FIG. 3 are indicated with the similar numerals. A resistance R11 indicated in the AS circuit 18 indicates the resistance component included in the transistor M12 or the condenser C13. The resistance value of the resistance R11 is, for example, 0.6 Ω.

The transistor M12 of the AS circuit 18 is turned on in the fixed voltage power mode. The load current (the current supplied to the amplifier 15) that flows into the power node N11 varies according to amplification operation of the radio signal of the amplifier 15. The load current flows also into the resistance R11 in the fixed voltage power mode. Therefore, the fixed voltage of the fixed voltage power source varies. The voltage of the power node N11 varies if the fixed voltage of the fixed voltage power source varies, and the source voltage of the linear amplifier (the transistor M11) varies. Thus, the current may be supplied to the power node N11 from the linear amplifier even in the fixed voltage power mode.

For example, in the fixed voltage power mode, the envelope signal to be input into the transistor M11 is in a no-signal state as illustrated in the waveform W11. For example, the bias voltage for B-class operation is supplied to the gate of the transistor M11 from the bias power source 17. The transistor M11 is turned off when the envelope signal in the no-signal state is input.

Here, in the fixed voltage power mode, the voltage of the power node N11 is reduced by the load current that flows into the resistance R11, and the source voltage of the transistor M11 is reduced. Due to the reduction of the source voltage, if the voltage between the gate sources illustrated with arrows A11 in FIG. 5 exceeds the threshold value of the transistor M11, the transistor M11 is turned on. That is, even in the fixed voltage power mode, the current is supplied to the power node N11 from the linear amplifier, and the power efficiency is reduced.

Figure 6A:
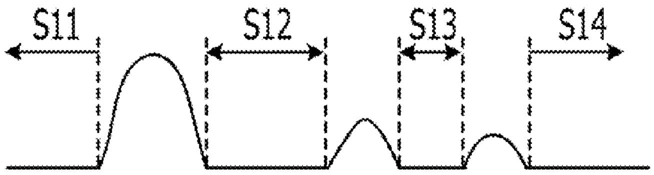
FIGS. 6A, 6B, 6C and 6D are diagrams illustrating the waveform of each unit illustrated in FIG. 5.
Figure 6B:
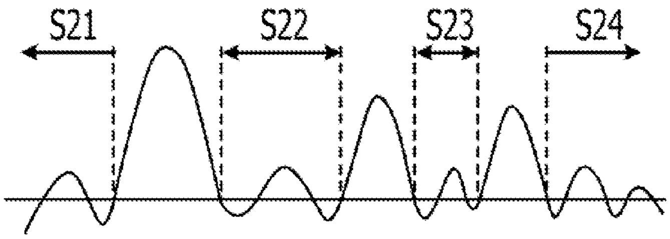
Figure 6C:
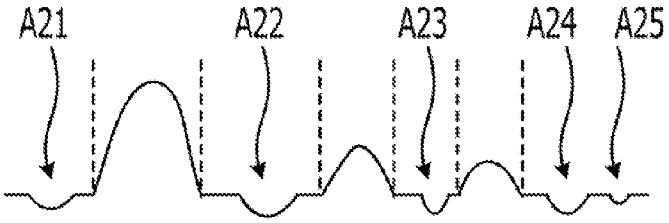
Figure 6D:
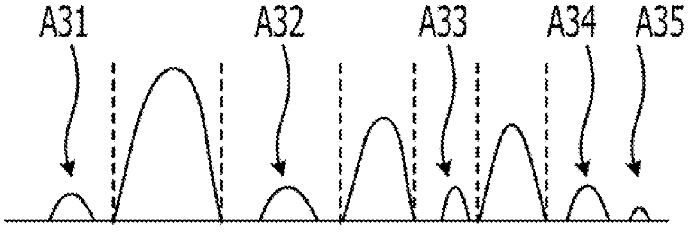

FIGS. 6A, 6B, 6C and 6D are diagrams illustrating a current waveform of each unit illustrated in FIG. 5. FIG. 6A indicates the envelope signal to be input into the gate of the transistor M11 illustrated in FIG. 5. FIG. 6B indicates the load current that flows into the power node N11. FIG. 6C indicates the source voltage of the transistor M11 illustrated in FIG. 5. FIG. 6D indicates the current to be output from the source of the transistor M11 illustrated in FIG. 5.

The periods from S11 to S14 illustrated in FIG. 6A indicate the fixed voltage power mode, and the envelope signal indicates a no-signal. Therefore, in the periods from S21 to S24 illustrated in FIG. 6B, the linear amplifier does not supply the power, and simply the voltage power source supplies the power.

In the fixed voltage power mode, the load current flows into the resistance R11 of the AS circuit 18, and the source voltage of the transistor M11 is reduced. That is, as illustrated with arrows A21 to A25 in FIG. 6C, the voltage of the source voltage of the transistor M11 is reduced.

The bias voltage of the voltage Vg is supplied to the gate of the transistor M11 where the voltage Vdc of the fixed voltage power source is provided as a standard voltage so that the transistor M11 performs the B-class operation. As described above, the source voltage of the transistor M11 is reduced according to the current flowing into the resistance R11 of the AS circuit 18, and the transistor M11 is turned on. Due to this, as illustrated with arrows A31 to A35 in FIG. 6D, the transistor M11 supplies the current (power) to the power node N11 even in the fixed voltage power mode. Accordingly, the power efficiency of the amplifying device decreases.

Figure 7:
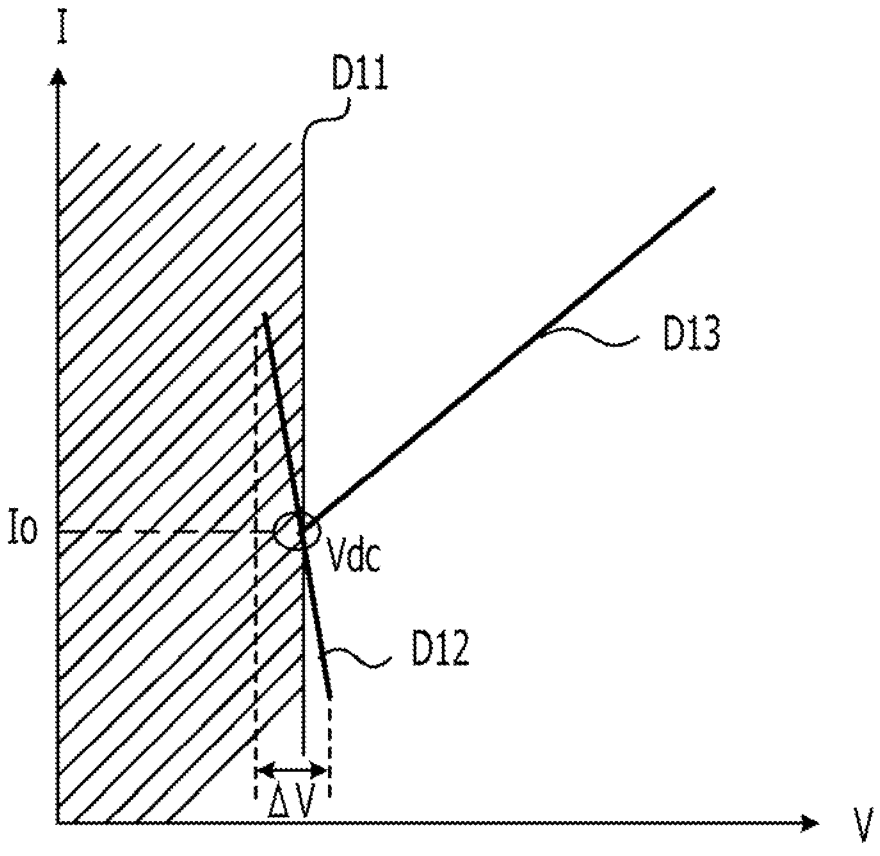
FIG. 7 is a diagram illustrating operation of the amplifying device illustrated in FIG. 5.

FIG. 7 is a diagram illustrating operation of the amplifying device illustrated in FIG. 5. In FIG. 7, the horizontal axis of the graph indicates the voltage, and the vertical axis indicates the current. If there is no resistance component in the AS circuit 18, that is, if the resistance R11 illustrated in FIG. 5 does not exist, the current that flows into the power node N11 varies on a straight line D11 illustrated in FIG. 7. That is, the current that flows into the power node N11 varies according to the fixed voltage Vdc.

However, since the transistor M12 or the condenser C13 of the AS circuit 18 includes the resistance component, fluctuation occurs between the voltage and the current as illustrated in the straight line D12 in FIG. 7. That is, in the fixed voltage power mode, the voltage of the power node N11 varies to be ΔV. The inclination indicates a resistance value of the resistance component included in the AS circuit 18.

The shaded area illustrated in FIG. 7 indicates an area in which the transistor M11 is turned on. That is, the transistor M11 is turned on if the voltage of the power node N11 is smaller than the voltage Vdc, and the transistor M11 supplies the current to the power node N11 even in the fixed voltage power mode.

In the variable voltage power mode, the voltage and the current of the power node N11 have the relation of the straight line D13 as illustrated in FIG. 7. That is, the voltage is proportional to the current in the relation. A current Io illustrated in FIG. 7 indicates a current value that is obtained when the fixed voltage power node is switched to the variable voltage power mode (zero cross).

Figure 8A:
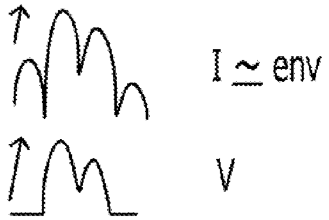
FIGS. 8A, 8B and 8C are diagrams illustrating a relation between a power and a voltage of a power node.
Figure 8B:
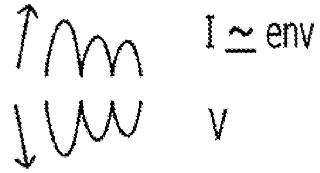
Figure 8C:
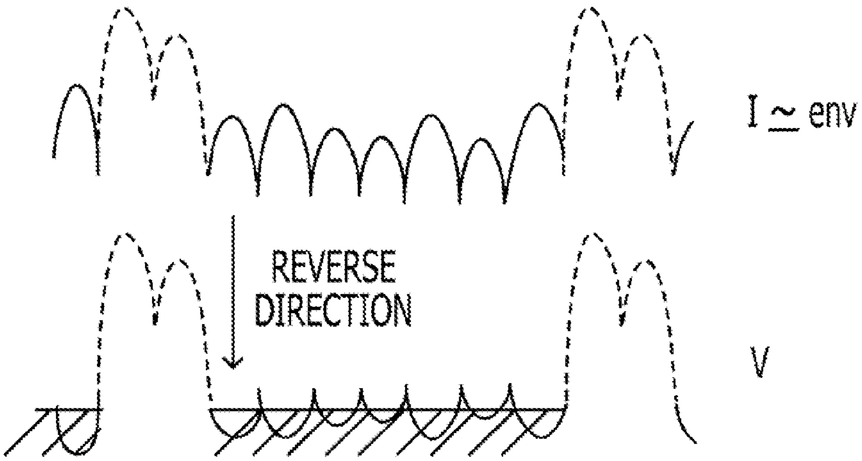

FIGS. 8A, 8B and 8C are diagrams illustrating a relation between the current and the voltage of the power node. FIG. 8A indicates a relation between the current and the voltage in the variable voltage power mode. FIG. 8B indicates a relation between the voltage and the current in the fixed voltage power mode. FIG. 8C illustrates a relation between the current and the voltage in the variable voltage power mode and the fixed voltage power mode.

In the variable voltage power mode, the current and the voltage flowing into the power node N11 have the relation indicated with the straight line D13 in FIG. 7. Therefore, as illustrated in FIG. 8A, the current is increased if the voltage is increased. The current that is supplied to the power node N11 (the amplifier 15) varies according to the envelope of the radio signal to be input into the amplifier 15.

In the fixed voltage power mode, because of the resistance component included in the AS circuit 18, the current and the voltage flowing into the power node N11 has the relation of the straight line D12 illustrated in FIG. 7. As illustrated in FIG. 8B, the voltage is increased if the current is increased.

The solid line waveform illustrated in FIG. 8C indicates the relation between the current and the voltage in the fixed voltage power mode, and the relation is indicated with the straight line D12 in FIG. 7. The dashed line waveform illustrated in FIG. 8C indicates the relation between the current and the voltage in the variable voltage power mode. The relation is indicated with the straight line D13 illustrated in FIG. 7. The shaded area illustrated in FIG. 8C indicates an area where the transistor M11 is turned on.

As illustrated in FIG. 8B, the voltage is reduced if the current is increased in the fixed voltage power mode. Therefore, as illustrated in FIG. 8C, the voltage of the power node N11 has the area where the transistor M11 is turned on.

Accordingly, the linear amplifier that performs the B-class operation does not supply the current to the power node N11 in an off period, that is, in the fixed voltage power mode. However, the linear amplifier may be turned on by the current flowing into the AS circuit 18 and supply the current to the power node N11. As a result, the current as waste current reduces the power efficiency.

The synthesis of the cancel signal will be described below in detail. The amplifying device illustrated in FIG. 3 synthesizes the envelope signal with the cancel signal so that the linear amplifier is not turned on and does not supply the power to the power node N11 in the fixed voltage power mode.

Figure 9:
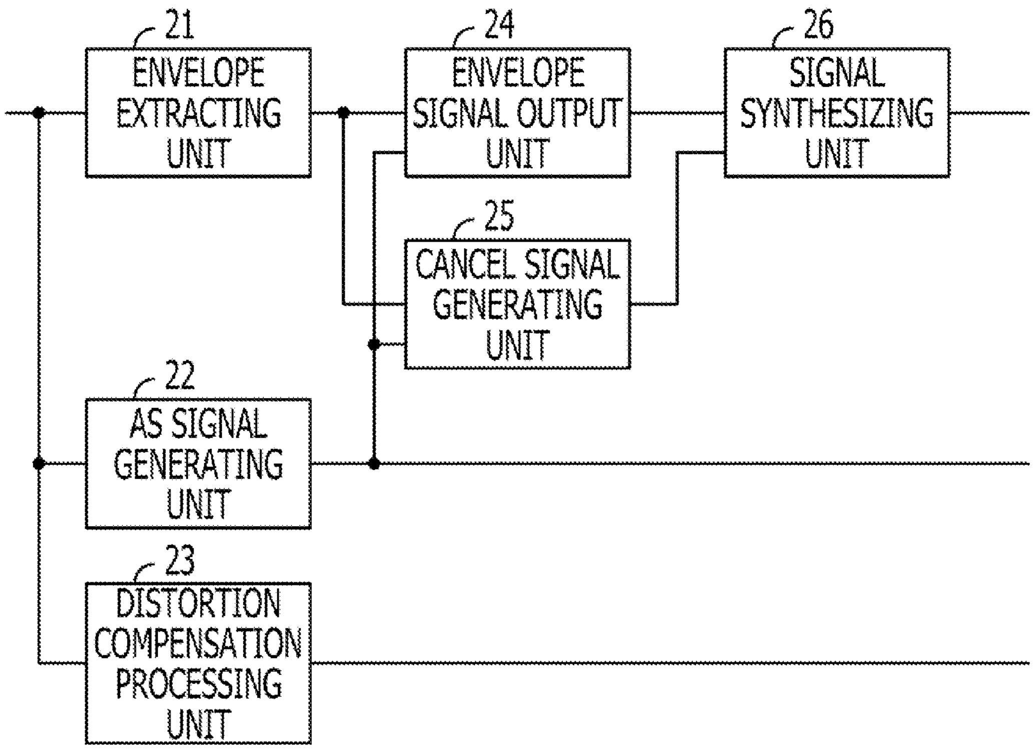
FIG. 9 is a block diagram of a digital signal processing unit.

FIG. 9 is a block diagram of the digital signal processing unit. As described above, the digital signal processing unit 11 has a function illustrated in FIG. 9 by being formed with a DSP and a CPU, for example, and executing a program stored in a memory. As illustrated in FIG. 9, the digital signal processing unit 11 includes an envelope extracting unit 21, an AS signal generating unit 22, a distortion compensation processing unit 23, an envelope signal output unit 24, a cancel signal generating unit 25, and a signal synthesizing unit 26.

The transmission signal is input into the envelope extracting unit 21. The envelope extracting unit 21 extracts the transmission signal that exceeds the prescribed threshold value. The radio signal to be input into the amplifier 15 is obtained by modulating the transmission signal. Therefore, the transmission signal to be input into the envelope extracting unit 21 is the envelope of the radio signal.

The transmission signal is input into the AS signal generating unit 22. In the period where the envelope of the transmission signal exceeds the first threshold value, if the envelope of the transmission signal exceeds the second threshold value that exceeds the first threshold value, the AS signal generating unit 22 generates the AS signal indicating that the AS circuit 18 releases the power node N11 from the AS (the transistor M12 is turned off). For example, the AS signal generating unit 22 generates the AS signal, which is in the L state in which the transistor M12 is turned off in the above-described period, and generates the AS signal, which is in the H state in which the transistor M12 is turned on in the other periods.

For the first threshold value, the zero cross level at which Alternating Current (AC) is near zero is set, for example. For the second threshold value, the level at which the fixed voltage power mode is transferred to the variable voltage power mode from the fixed voltage power mode.

The transmission signal is input into the distortion compensation processing unit 23. The distortion compensation processing unit 23 performs distortion compensation processing of the transmission signal and outputs the transmission signal to the DAC 12. Based on the signal extracted by the envelope extracting unit 21 and the AS signal output from the AS signal generating unit 22, the envelope signal output unit 24 outputs the envelope signal. For example, the envelope signal output unit 24 outputs the signal, which is extracted by the envelope extracting unit 21, as an envelope signal if the AS signal is in the L state, and the envelope signal output unit 24 outputs a fixed voltage (a no-signal, for example, 0V) if the AS signal is in the H state. That is, the envelope signal output unit 24 outputs the signal that is extracted by the envelope extracting unit 21 in the variable voltage power mode (the AS signal in the L state), and the envelope signal output unit 24 outputs the no-signal in the fixed voltage power mode (the AS signal in the H state).

Based on the signal extracted by the envelope extracting unit 21 and on the AS signal output from the AS signal generating unit 22, the cancel signal generating unit 25 generates a cancel signal. For example, based on the signal extracted by the envelope extracting unit 21 and on the AS signal output from the AS signal generating unit 22, the cancel signal generating unit 25 generates the cancel signal that varies in the similar way in which the voltage of the power node N11 varies in the fixed voltage power mode. Specifically, by reversing the signal extracted by the envelope extracting unit 21, the cancel signal generating unit 25 generates the cancel signal that is subjected to amplitude adjustment.

Figure 10A:
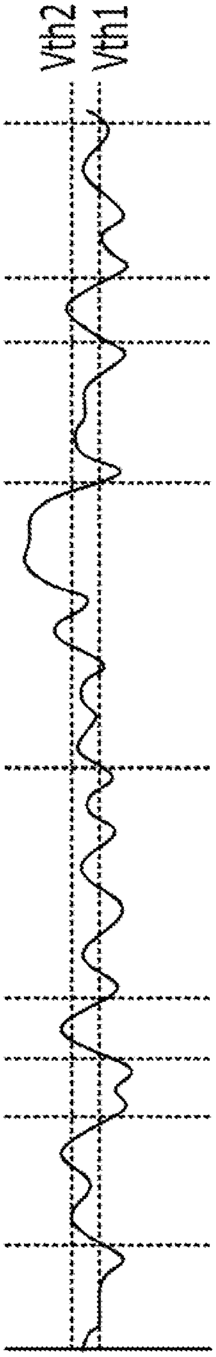
FIGS. 10A, 10B, 10C, 10D, 10E and 10F are diagrams illustrating the signal waveform of each unit illustrated in FIG. 9.
Figure 10B:
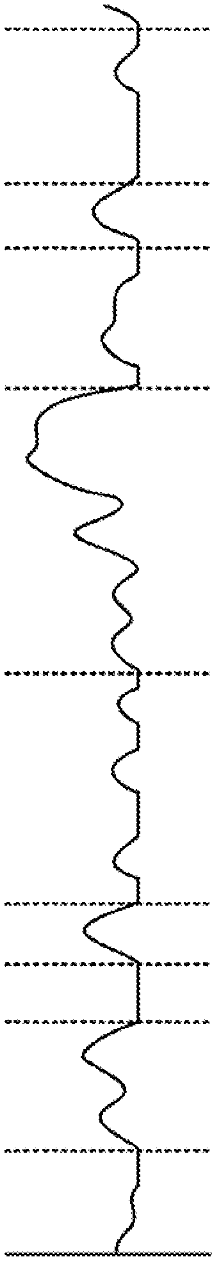
Figure 10C:
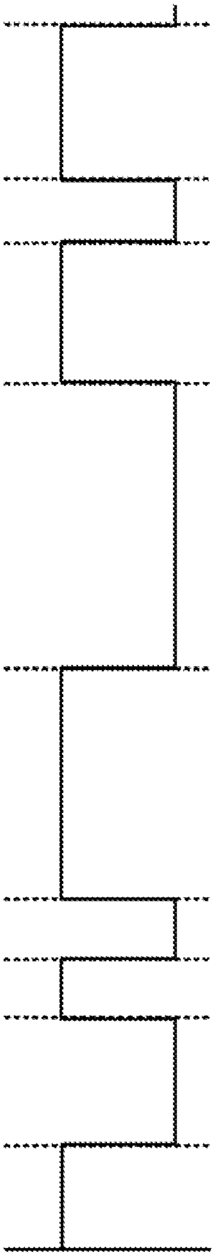
Figures 10D, 10E, 10F:
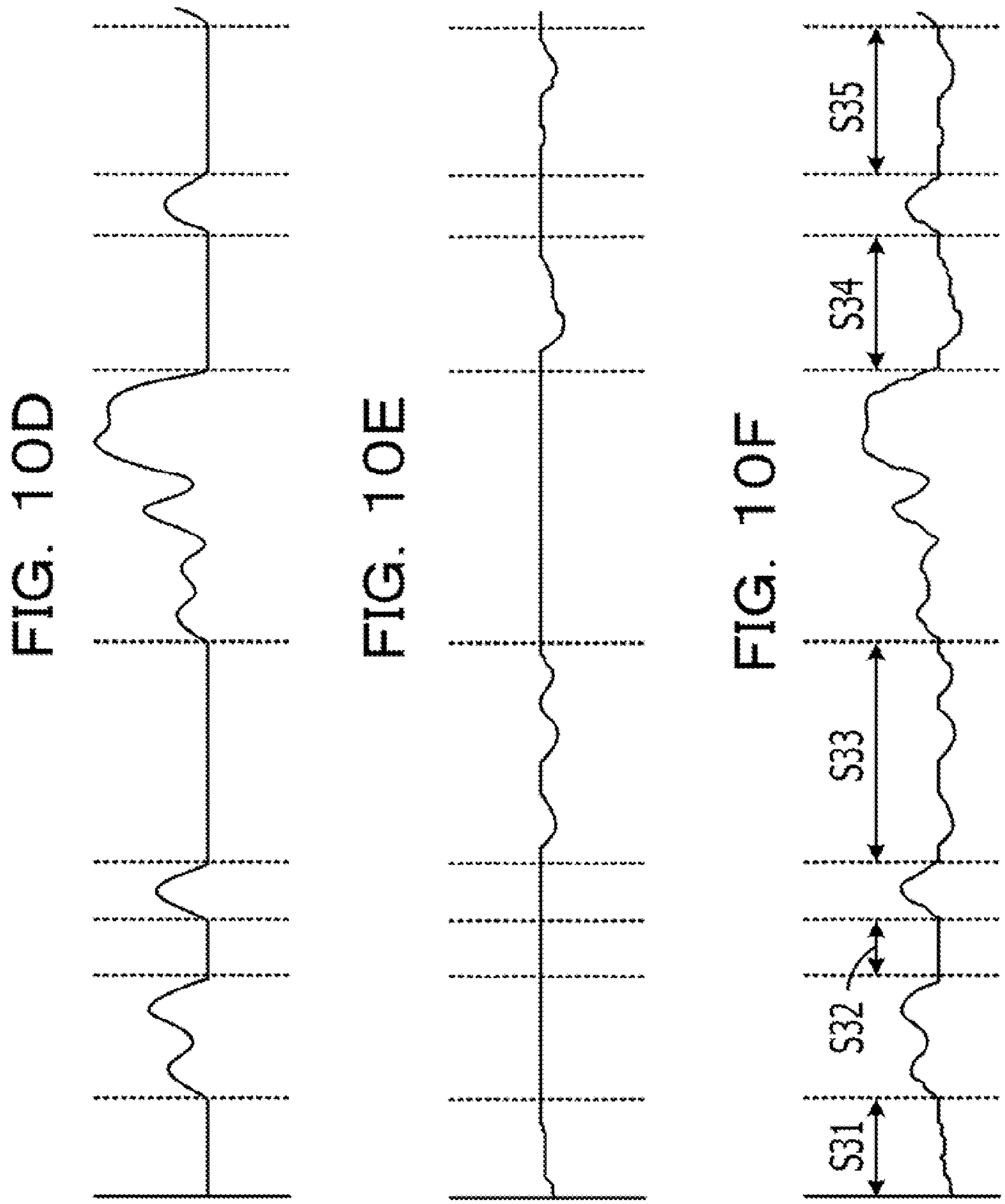

The signal synthesizing unit 26 synthesizes the envelope signal output from the envelope signal output unit 24 and the cancel signal and outputs the synthesized signal to the gate of the transistor M11. FIGS. 10A, 10B, 10C, 10D, 10E and 10F are diagrams illustrating the signal waveform of each unit illustrated in FIG. 9. FIG. 10A indicates the waveform of the transmission signal input into the envelope extracting unit 21, the AS signal generating unit 22, and the distortion compensation processing unit 23. FIG. 10B indicates the waveform of the signal output from the envelope extracting unit 21. FIG. 10C indicates the waveform of the AS signal output from the AS signal generating unit 22. FIG. 10D indicates the waveform of the envelope signal output from the envelope signal output unit 24. FIG. 10E indicates the waveform of the cancel signal output from the cancel signal generating unit 25. FIG. 10F indicates the waveform of the envelope signal output from the signal synthesizing unit 26. In FIG. 10A, the threshold value Vth1 indicates the first threshold value, the threshold value Vth2 indicates the second threshold value. The relation is indicated as Vth1<Vth2.

As illustrated in FIGS. 10A and 10B, the envelope extracting unit 21 extracts the transmission signal that is sliced by the threshold value Vth1. For example, the envelope extracting unit 21 outputs the transmission signal if the input transmission signal exceeds the threshold value Vth1, and outputs the no-signal (for example, the fixed voltage of 0V) if the transmission signal is equal to or smaller than the threshold value Vth1.

As illustrated in FIGS. 10A and 10C, the AS signal generating unit 22 determines whether or not the transmission signal exceeds the threshold value Vth1. If the transmission signal is equal to or smaller than the threshold value Vth1, the AS signal generating unit 22 outputs the AS signal that is in the H state. In the periods in which the transmission signal exceeds the threshold value Vth1, the AS signal generating unit 22 outputs the AS signal in the L state if the transmission signal is greater than the threshold value Vth2, and outputs the AS signal in the H state if the transmission signal is equal to or smaller than the threshold value Vth2.

As illustrated in FIG. 10D, the envelope signal output unit 24 outputs the signal, which is extracted by the envelope extracting unit 21, as the envelope signal if the AS signal is in the L state, that is, in the variable voltage power mode. The envelope signal output unit 24 outputs the no-signal (for example, the fixed voltage of 0V) as the envelope signal if the AS signal is in the H state, that is, in the fixed voltage power mode.

As illustrated in FIGS. 10B, 10C, and 10E, the cancel signal generating unit 25 generates the cancel signal by reversing the signal extracted by the envelope extracting unit 21 if the AS signal is in the H state and adjusting the amplitude of the signal. The amplitude adjustment will be described below in detail.

As illustrated in FIGS. 10D, 10E and 10F, the signal synthesizing unit 26 synthesizes the envelope signal, which is output from the envelope signal output unit 24, and the cancel signal, which is output from the cancel signal generating unit 25. The envelope signal resulted in the synthesis of the cancel signal is input into the gate of the transistor M11. The periods from S31 to S35 illustrated in FIG. 10 indicate the fixed voltage power mode.

For example, as illustrated in FIG. 6C, the source voltage of the transistor M11 may be reduced in the fixed voltage power mode (the arrows A21 to A25). Therefore, the voltage between the gate and the source of the transistor M11 exceeds the threshold value, and the transistor M11 is turned on. As illustrated in FIG. 6D, the waste current is supplied to the amplifier 15.

However, in the amplifying device illustrated in FIG. 3 and FIG. 9, the envelope signal and the cancel signal are synthesized so that the transistor M11 is not turned on in the fixed voltage power mode. For example, as illustrated with the arrows A21 to A26 in FIG. 6C, even if the source voltage of the transistor M11 is reduced, the voltage of the envelope signal supplied to the gate of the transistor M11 is reduced as illustrated in the periods from S31 to S35 in FIG. 10F. Thus, the transistor M11 is not turned on. That is, by synthesizing the envelope signal and the cancel signal that varies in the similar way in which the voltage of the power node N11 varies in the fixed voltage power mode, the amplifying device does not allow the linear amplifier to supply the power to amplifier 15. As a result, the amplifying device may suppress the reduction of the power efficiency.

The amplitude adjustment of the cancel signal generating unit 25 will be described below. The amplifier 15 consumes the power that is proportional to the envelope of the input radio signal. Accordingly, the current that flows into the power node N11 varies according to the envelope of the radio signal. The current flowing into the power node N11 flows into the resistance R11 included in the AS circuit 18. As illustrated in FIG. 8B, the source voltage of the transistor M11 varies according to the envelope that inverts the positive/negative of the current flowing into the power node N11.

That is, the amplitude of the cancel signal may be calculated in advance based on the resistance value of the resistance R11 included in the AS circuit 18 and on the load current of the amplifier 15. For example, based on the resistance value and the load current of the resistance R11, the ratio to be adjusted of the amplitude of the inverted envelope may be calculated in advance. The cancel signal generating unit may adjust the amplitude of the cancel signal by multiplying the reversed envelope by the ratio calculated in advance.

Each unit illustrated in FIG. 9 performs processing in such a way that the timing of the AS signal output from the AS signal generating unit 22 matches the timing of the transmission signal output from the distortion compensation processing unit 23 as illustrated in FIG. 10.

Figure 11:
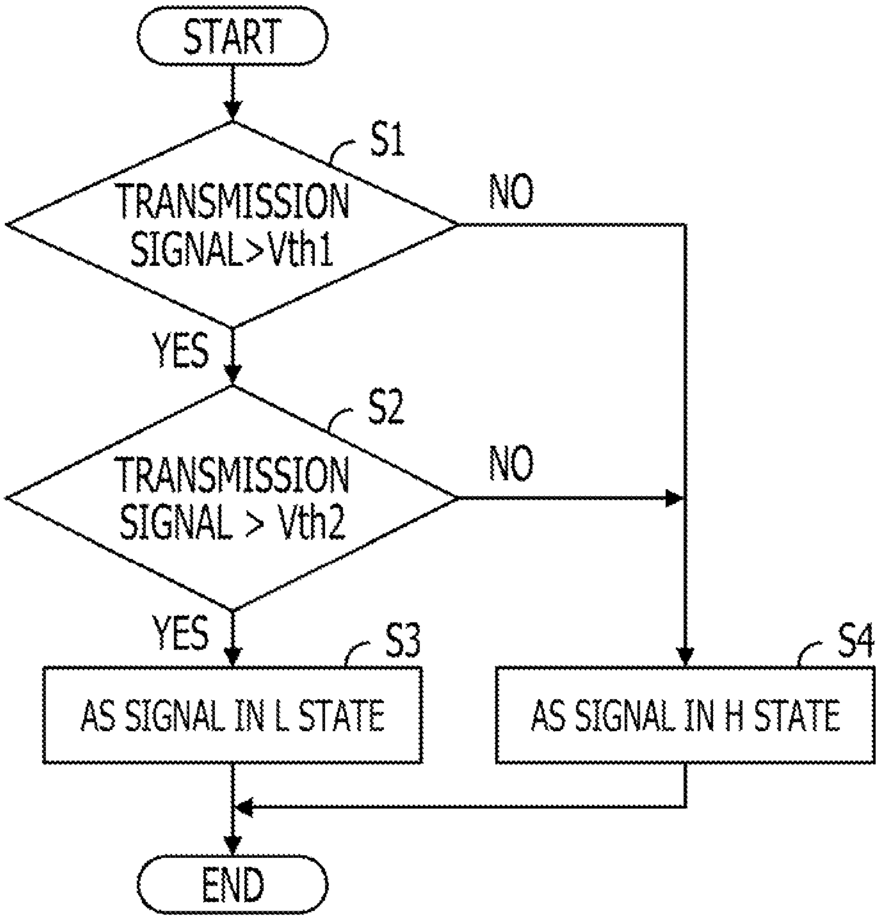
FIG. 11 is a flowchart illustrating generation operation of an AS signal.

FIG. 11 is a flowchart illustrating generation operation of the AS signal.

[Operation S1] The AS signal generating unit 22 determines whether or not the input transmission signal exceeds the threshold value Vth1. If the transmission signal to be input exceeds the threshold value Vth1, the AS signal generating unit 22 goes to Operation S2. If the transmission signal to be input is equal to or smaller than the threshold value Vth1, the AS signal generating unit 22 goes to Operation S4.

[Operation S2] The AS signal generating unit 22 determines whether or not there is a part where the transmission signal exceeds the threshold value Vth2 in a period in which the transmission signal exceeds the threshold value Vth1. The threshold value has the relation indicated as Vth1<Vth2. If there is the part where the input transmission signal exceeds the threshold value Vth2 in the above-described period, the AS signal generating unit 22 goes to Operation S3. If there is no part where the input transmission signal exceeds the threshold value Vth2 in the above-described period, the AS signal generating unit 22 goes to Operation S4.

[Operation S3] The AS signal generating unit 22 generates the AS signal in the L state.

Figure 12:
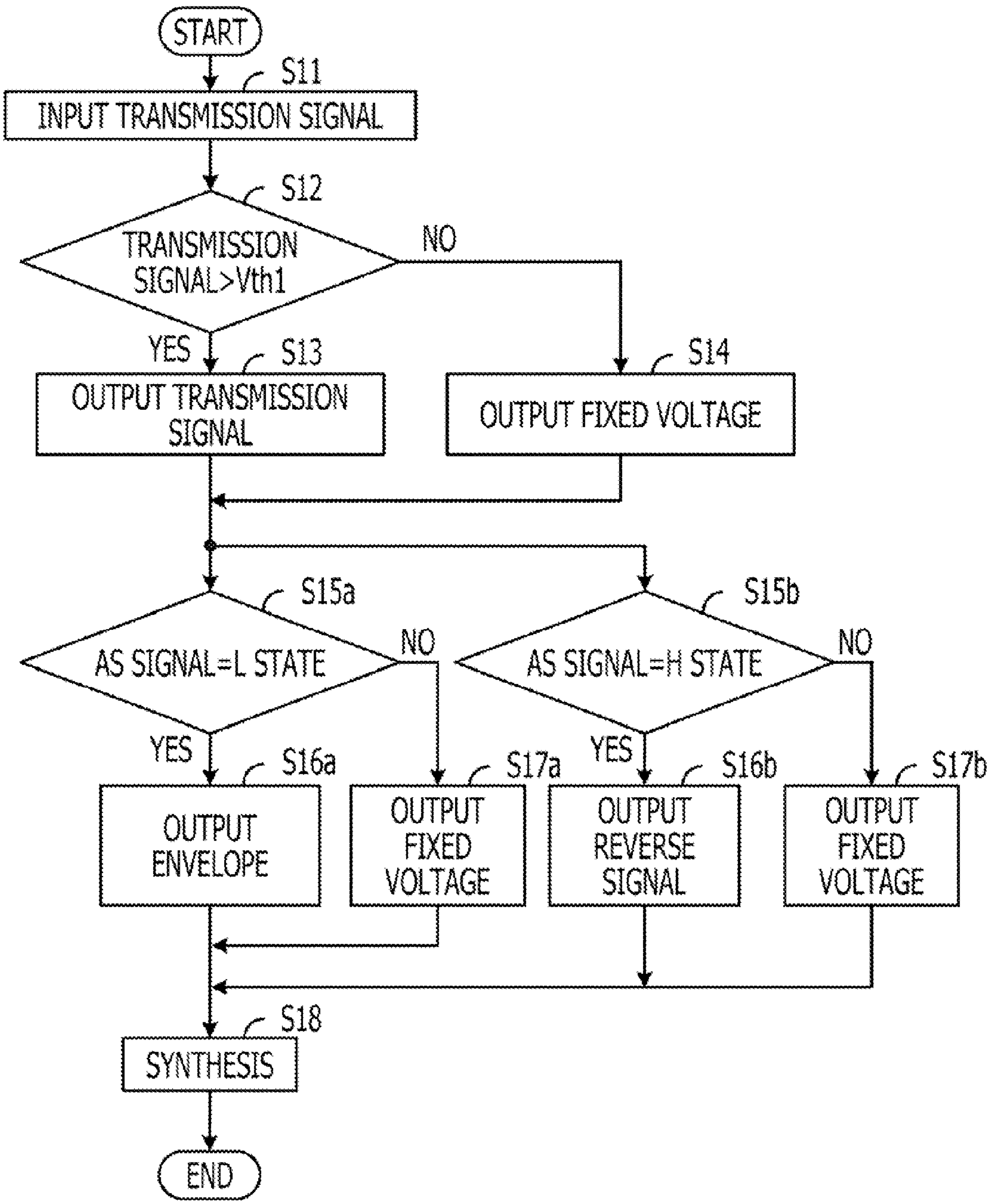
FIG. 12 is a flowchart illustrating the generation operation of an envelope signal.

[Operation S4] The AS signal generating unit 22 generates the AS signal in the H state. FIG. 12 is a flowchart illustrating generation operation of the envelope signal.

[Operation S11] The envelope extracting unit 21 inputs the transmission signal.

[Operation S12] The envelope extracting unit 21 determines whether or not the input transmission signal exceeds the threshold value Vth1. The envelope extracting unit 21 goes to Operation S13 if the input transmission signal exceeds the threshold value Vth1. If the input transmission signal is equal to or smaller than the threshold value Vth1, the envelope extracting unit 21 goes to Operation S14.

[Operation S13] The envelope extracting unit 21 outputs the input transmission signal.

[Operation S14] The envelope extracting unit 21 outputs the no-signal. The processing from Operations S15*a* to 17*a* and the processing from Operations S15*b* to 17*b* are performed in parallel.

[Operation S15*a*] The envelope signal output unit 24 determines whether or not the AS signal output from the AS signal generating unit 22 is in the L state. If the AS signal output from the AS signal generating unit 22 is in the L state, the envelope signal output unit 24 goes to Operation S16*a*. If the AS signal output from the AS signal generating unit 22 is in the H state, the envelope signal output unit 24 goes to Operation S17*a*.

[Operation S16*a*] The envelope signal output unit 24 outputs the transmission signal extracted by the envelope extracting unit 21 to the signal synthesizing unit 26. [Operation S17*a*] The envelope signal output unit 24 outputs the no-signal to the signal synthesizing unit 26.

[Operation S1513] The cancel signal generating unit 25 determines whether or not the AS signal output from the AS signal generating unit 22 is in the H state. If the AS signal output from the AS signal generating unit 22 is in the H state, the cancel signal generating unit 25 goes to Operation S16*b*. If the AS signal output from the AS signal generating unit 22 is in the L state, the cancel signal generating unit 25 goes to Operation S17*b*.

[Operation S16*b*] The cancel signal generating unit 25 inverts the transmission signal that is extracted by the envelope extracting unit 21, generates the cancel signal subjected to the amplitude adjustment, and outputs the cancel signal to the signal synthesizing unit 26.

[Operation S17*b*] The cancel signal generating unit 25 outputs the no-signal to the signal synthesizing unit 26.

[Operation S18] The signal synthesizing unit 26 synthesizes the envelope signal output from the envelope signal output unit 24 and the cancel signal output from the cancel signal generating unit 25 and then outputs the synthesized signal to the linear amplifier.

Figure 13A:
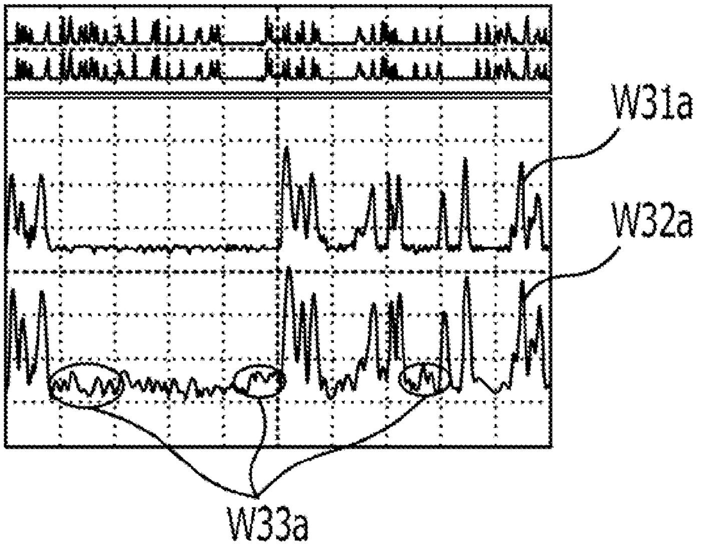
FIGS. 13A and 13B are diagrams illustrating diagrams of a measurement result of load current flowing into an amplifier.
Figure 13B:
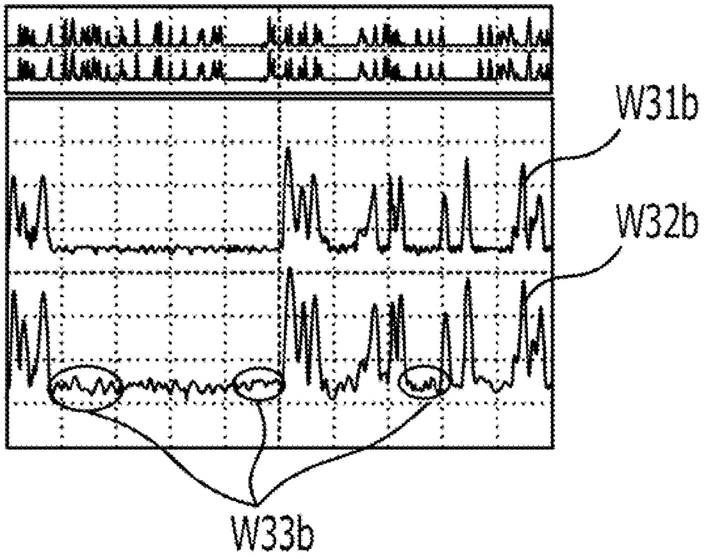

FIGS. 13A and 13B are diagrams illustrating a measurement result of the load current flowing into the amplifier. FIG. 13A indicates a measurement result of the load current in a case where the envelope signal and the cancel signal are not synthesized. FIG. 13B indicates a measurement result of the load current in a case where the envelope signal and the cancel signal are synthesized.

In FIGS. 13A and 13B, waveforms W31*a* and W31*b* indicate the output voltage of the linear amplifier (the source of the transistor M11), and waveforms W32*a* and W32*b* indicate the current supplied to the amplifier 15. As illustrated in FIG. 13, waveforms W33*a* and W33*b* indicate that the load current of the amplifier 15 is reduced when the envelope signal and the cancel signal are synthesized.

Figure 14:
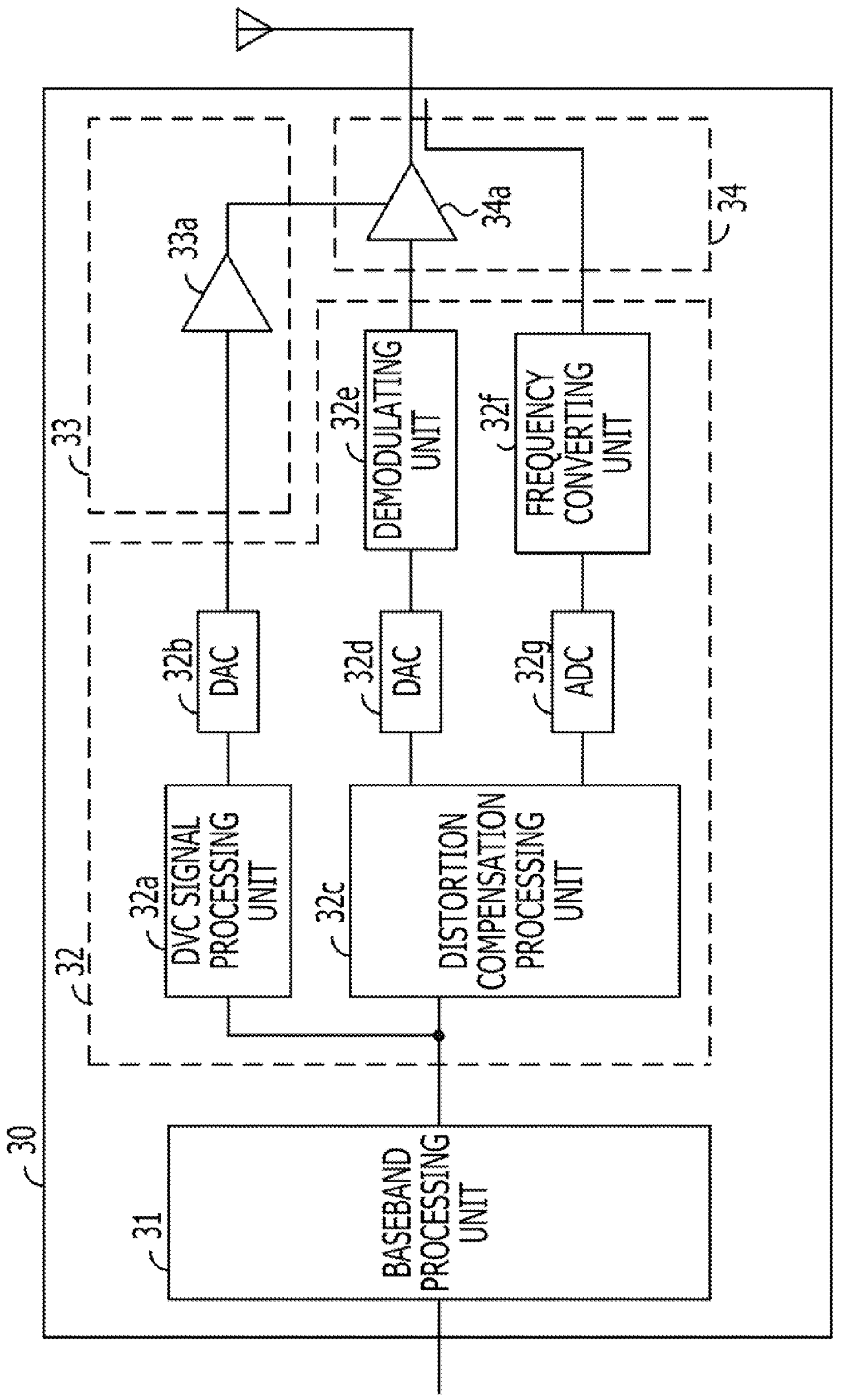
FIG. 14 is a diagram illustrating an example of an amplifying device applied as a radio device.

FIG. 14 is a diagram illustrating an example of a case where the amplifier is applied to the radio device. For example, the amplifying device illustrated in FIG. 3 is applied to the transmission unit of the base station of the mobile phone system. As illustrated in FIG. 14, a transmitting unit 30 includes a baseband processing unit 31, a digital processing unit 32, a Dynamic Voltage Control (DVC) power source unit 33, and a Radio Frequency (RF) unit 34. The digital processing unit 32 includes a DVC signal processing unit 32*a*, a DAC 32*b*, a DAC 32*d*, a distortion compensation processing unit 32*c*, a modulating unit 32*e*, a frequency converting unit 32*f*, and an Analog to Digital Converter (ADC) 32*g*. The DVC power source unit 33 includes a power source 33*a*. The RF unit 34 includes an amplifier 34*a*.

The transmission signal is input into the baseband processing unit 31. The baseband processing unit 31 performs baseband processing on the transmission signal. For example, the DVC signal processing unit 32*a* and the distortion compensation processing unit 32*c* of the digital processing unit 32 correspond to the digital signal processing unit 11 illustrated in FIG. 3. For example, the DACs 32*b* and 32*d* correspond to the DACs 16 and 12 illustrated in FIG. 3, respectively. For example, the modulating unit 32*e* corresponds to the oscillator 13 and the multiplier 14 illustrated in FIG. 13.

The ADC 32*g* and the frequency converting unit 32*f* are not illustrated in FIG. 3. The frequency converting unit 32*f* down-converts the frequency of the radio signal that is amplified by the amplified 34*a*. The ADC 32*g* digital-analog converts the down-converted radio signal. Based on the transmission signal output from the baseband processing unit 31 and the feedback signal output from the ADC 32*g*, the distortion compensation processing unit 32*c* performs the distortion compensation processing on the transmission signal to be output to the DAC 32*d*.

For example, the power source 33*a* corresponds to the condensers C11 and C12, the transistor M11, the bias power source 17, the inductor L11, and the AS circuit 18. For example, the amplifier 34*a* corresponds to the amplifier 15 illustrated in FIG. 3.

In this manner, the amplifying device synthesizes the envelope signal and the cancel signal so that the linear amplifier does not supply the power to the power node N11 according to the voltage variation of the power node N11 by the AS circuit 18. Accordingly, the linear amplifier of the amplifying device does not supply the power to the amplifier 15 in the fixed voltage power mode. This may suppress the reduction of the power efficiency.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. An amplifying device comprising:

an amplifier which amplifies an input signal by a power supplied from a power node;

a first power source which supplies a fixed voltage to the power node;

a second power source which supplies a variable voltage to the power node based on an envelope signal relating to the input signal and voltage of the power node;

an active short device which reduces impedance of the power node when the first power source supplies the power to the power node and the second power source does not supply the power to the power node;

a processor confined to synthesizer the envelope signal and a cancel signal so that the second power source does not supply the power to the power node according to voltage variation of the power node by the active short device.

2. The amplifying device according to claim 1, wherein the processor is further configured to:

extract the envelope of the input signal which is greater than a prescribed threshold value; and output the envelope signal based on the signal extracted and on an active short signal which controls impedance of the active short device.

3. The amplifying device according to claim 2, wherein the processor is confined to generate the active short signal applied to the active short device in a period where the envelope of the input signal is greater than the first threshold value when the envelope of the input signal is greater than a second threshold value that is greater than the first threshold value.

4. The amplifying device according to claim 3, wherein the processor is configured to generate the cancel signal based on the active short signal generated and on the signal extracted.

5. The amplifying device according to claim 4, wherein the processor is configured to generate the cancel signal by inverting the signal extracted and by performing adjustment of an amplitude of the signal, when the active short signal is output.

6. The amplifying device according to claim 1, wherein the cancel signal varies in a manner consistent with the voltage variation of the power node.

7. An amplifying method, comprising:

amplifying an input signal by a power supplied from a power node;

reducing, by an active short device, impedance of the power node when a first power source supplies the power to the power node and a second power source does not supply the power to the power node, the first power source supplying a fixed voltage to the power node, and the second power source supplying a variable voltage to the power node based on an envelope signal relating to the input signal and a voltage of the power node; and synthesizing the envelope signal and a cancel signal so that the second power source does not supply the power to the power node according to voltage variation of the power node by the active short device.

8. The amplifying method according to claim 7, further comprising:

extracting an envelope of the input signal which is greater than a prescribed threshold value, and outputting the envelope signal based on a signal extracted by the extracting and on an active short signal which controls impedance of the active short device.

9. The amplifying method according to claim 8, further comprising:

generating the active short signal in a period where the envelope of the input signal is greater than a first threshold value when the envelope of the input signal is greater than a second threshold value that is greater than the first threshold value.

10. The amplifying method according to claim 8, further comprising:

generating the cancel signal based on the active short signal and on the output signal.

11. The amplifying method according to claim 8, further comprising:

generating the cancel signal by inverting the output signal and by adjusting an amplitude of the signal, when the active short signal is output.

12. The amplifying device according to claim 7, further comprising:

generating the cancel signal which varies in a manner consistent with the voltage variation of the power node.

* * * * *